United States Patent
Balakrishnan et al.

(10) Patent No.: US 9,856,726 B2
(45) Date of Patent: Jan. 2, 2018

(54) HIGHER ORDER SIMULATION OF HYDROCARBON FLOWS OF HYDRAULIC FRACTURE TREATMENTS

(71) Applicant: Halliburton Energy Services, Inc., Houston, TX (US)

(72) Inventors: Uma Balakrishnan, Fremont, CA (US); Dinesh Ananda Shetty, Sugar Land, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/912,848

(22) PCT Filed: Dec. 23, 2014

(86) PCT No.: PCT/US2014/072190
§ 371 (c)(1),
(2) Date: Feb. 18, 2016

(87) PCT Pub. No.: WO2016/105390
PCT Pub. Date: Jun. 30, 2016

(65) Prior Publication Data
US 2016/0348489 A1    Dec. 1, 2016

(51) Int. Cl.
*G06G 7/48* (2006.01)
*E21B 43/26* (2006.01)
*E21B 44/00* (2006.01)
*E21B 41/00* (2006.01)
*E21B 49/00* (2006.01)
*E21B 43/14* (2006.01)

(52) U.S. Cl.
CPC .......... *E21B 43/26* (2013.01); *E21B 41/0092* (2013.01); *E21B 44/00* (2013.01); *E21B 49/00* (2013.01); *E21B 43/14* (2013.01)

(58) Field of Classification Search
CPC ...... E21B 43/26; E21B 49/00; E21B 41/0092; E21B 43/14
USPC .......................................... 703/10
See application file for complete search history.

(56) References Cited

U.S. PATENT DOCUMENTS

| | | |
|---|---|---|
| 5,740,342 A | 4/1998 | Kocberber |
| 2001/0056339 A1 | 12/2001 | Robinson et al. |
| 2010/0057418 A1 | 3/2010 | Li et al. |

(Continued)

OTHER PUBLICATIONS

International Search Report and Written Opinion, Application No. PCT/US2014/072190; 12 pages, dated Sep. 1, 2015.

(Continued)

*Primary Examiner* — Saif Alhija
(74) *Attorney, Agent, or Firm* — Baker Botts L.L.P.

(57) ABSTRACT

Higher order simulation of hydrocarbon flows associated with complex fractures produced in the hydraulic fracturing process in a well system may be used to obtain high fidelity results while minimizing a cost of computation. The higher order simulation of hydrocarbon flows may provide efficient and stable simulation algorithms that avoid any artificial boundary treatment inconsistent with the governing equations, while maintaining a uniform order of accuracy. In particular, a re-normalization technique implements higher-order finite difference/finite volume discretization near the boundary of the complex fractures. The simulation of hydrocarbon flows may be used to determine a production activity for the well system.

18 Claims, 6 Drawing Sheets

(56) References Cited

U.S. PATENT DOCUMENTS

2014/0136171 A1     5/2014   Sword, Jr. et al.
2014/0200811 A1     7/2014   Wuestefeld et al.

OTHER PUBLICATIONS

Berthelsen, Petter A., "A local directional ghost cell approach for incompressible viscous flow problems with irregular boundaries,." Journal of Computational Physics, vol. 227, pp. 4354-4397, 2008.
Macklin Paul, et al., "A New Ghost Cell/Level Set Method for Moving Boundary Problems: Application to Tumor Growth," Journal of Scientific Computing, vol. 35, pp. 266-299, 2008.
Nam, J.W., et al., "A ghost-cell immersed boundary method for large-eddy simulations of compressible turbulent flows," International Jounral of Computational Fluid Dynamics, vol. 28, pp. 41-55, 2014.

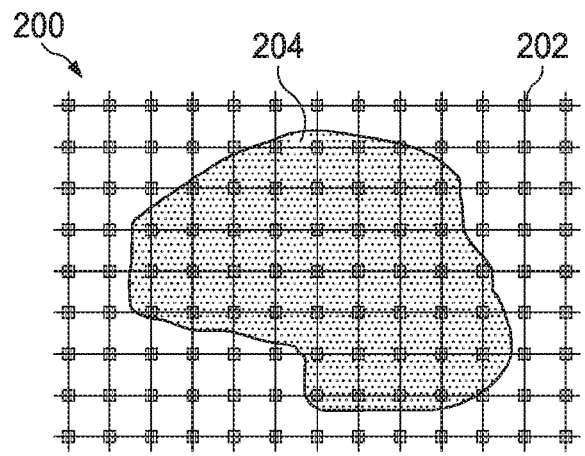
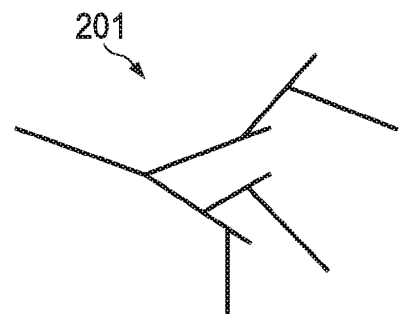
FIG. 2A
FIG. 2B
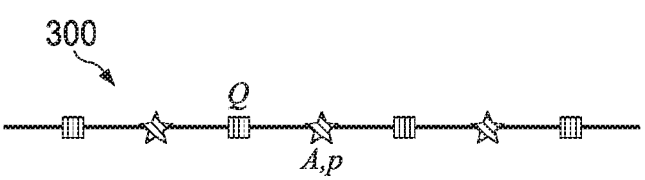
FIG. 3A
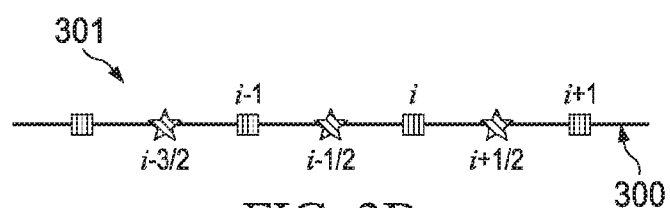
FIG. 3B
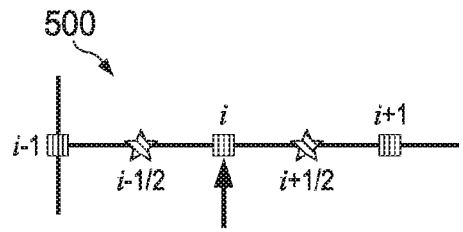
FIG. 5

HIGHER ORDER SIMULATION OF HYDROCARBON FLOWS OF HYDRAULIC FRACTURE TREATMENTS

RELATED APPLICATION

This application is a U.S. National Stage Application of International Application No. PCT/US2014/072190 filed Dec. 23, 2014, which designates the United States, and which is incorporated herein by reference in its entirety.

TECHNICAL FIELD

This disclosure relates generally to hydraulic fracture treatments and, more particularly, to higher order simulation of hydrocarbon flows of hydraulic fracture treatments.

BACKGROUND

Natural resources, such as hydrocarbons and water, are commonly obtained from subterranean formations that may be located onshore or offshore. The development of subterranean operations and the processes involved in removing hydrocarbons from a subterranean formation typically involve a number of different steps such as, for example, drilling a borehole at a desired well site, treating the borehole to optimize production of hydrocarbons, and performing the necessary steps to produce and process the hydrocarbons from the subterranean formation.

In hydraulic fracturing, stimulation treatments are applied to a subterranean formation by injection. The injection treatments are typically applied to induce fractures in the subterranean formation, and thereby enhance productivity of natural resources from the subterranean formation. Pressures generated by a stimulation treatment may induce low-amplitude or low-energy seismic events in the subterranean formation. As fractures are generated in the subterranean formation in association with the seismic events, hydrocarbons may begin to flow from the fractures and may be captured via the borehole.

FIGURES

Some specific exemplary embodiments of the disclosure may be understood by referring, in part, to the following description and the accompanying drawings.

FIG. 2A illustrates an exemplary discretization of a domain of interest;

FIG. 2B illustrates an exemplary representation of hydraulic fractures as 1-dimensional hydrocarbon flows;

FIG. 3A illustrates an exemplary arrangement of flow variables, Q, A, and p on a staggered flow grid;

FIG. 3B illustrates an exemplary arrangement of nodes on a staggered flow grid;

FIG. 5 illustrates an exemplary staggered flow grid at a domain boundary;

Figure 1A:
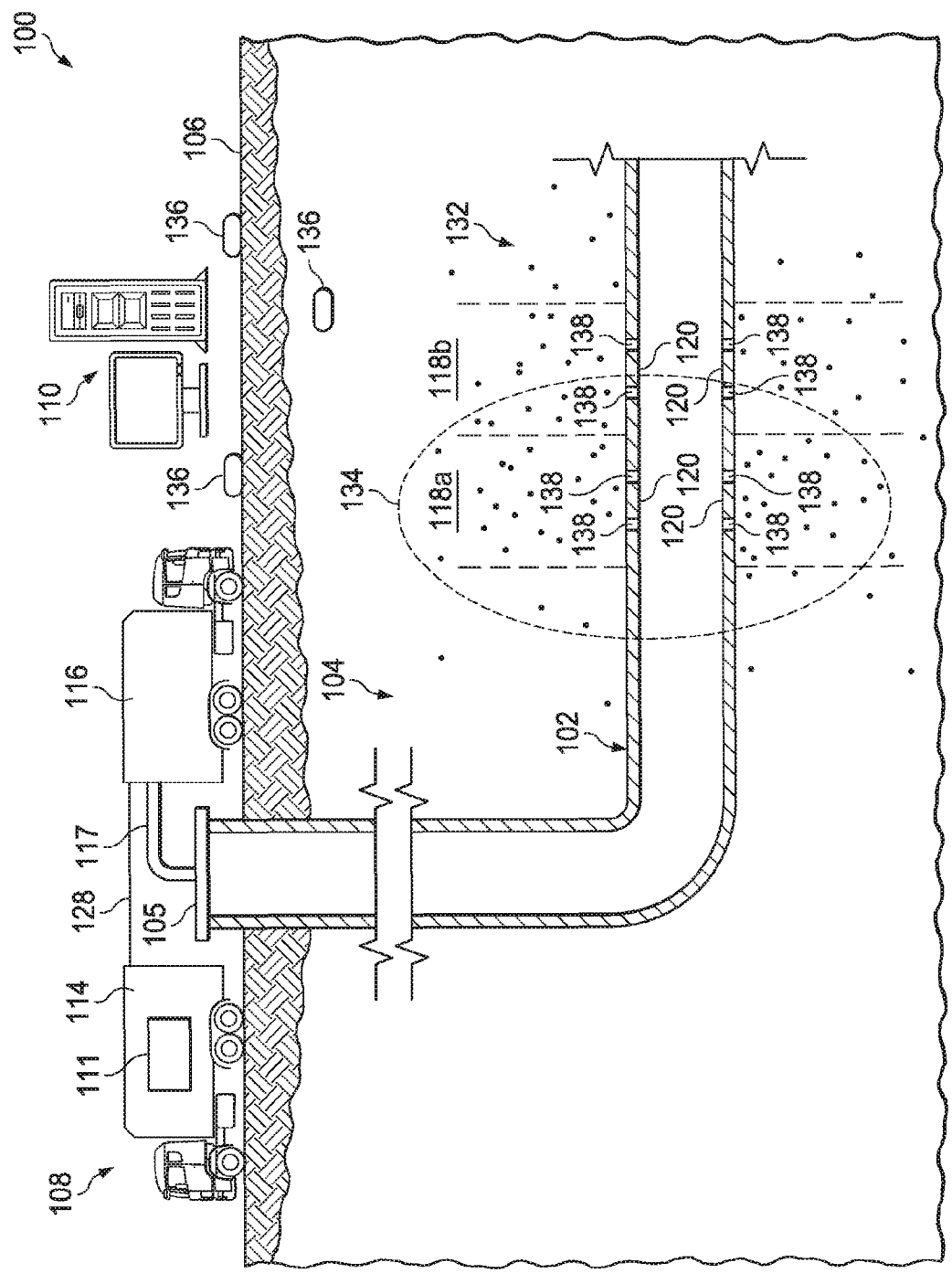
FIG. 1A illustrates a cross section of an exemplary well system.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and are not exhaustive of the scope of the disclosure.

DESCRIPTION OF PARTICULAR EMBODIMENT(S)

The present disclosure relates generally to simulation of hydrocarbon flows to evaluate a production viability of a particular well site or subterranean formation for a hydraulic fracturing process.

To facilitate a better understanding of the present disclosure, the following examples are presented for descriptive purposes. In no way should the following examples be read to limit, or define, the scope of the disclosure. Embodiments of the present disclosure may be applicable to horizontal, vertical, deviated, multilateral, u-tube connection, intersection, bypass (drill around a mid-depth stuck fish and back into the well below), or otherwise nonlinear boreholes in any type of subterranean formation. Embodiments may be applicable to injection wells as well as production wells, including natural resource production wells such as hydrogen sulfide, hydrocarbons or geothermal wells. Devices and methods in accordance with embodiments described herein may be used in one or more of wire line, slick line, measurement while drilling (MWD) and logging while drilling (LWD) operations. Embodiments described below with respect to one implementation, such as wire line, are not intended to be limiting. Embodiments may be implemented in various formation tools suitable for measuring, data acquisition and/or recording data along sections of the formation that, for example, may be conveyed through flow passage in a tubular string or using a wire line, slick line, tractor, piston, piston-tractor, coiled tubing, downhole robot or the like.

Among other techniques used to characterize a stimulated subterranean region for hydraulic fracturing, hydrocarbon flows from the stimulated region may be simulated. The hydrocarbon flow simulation may use continuous equations describing the actual physics of the hydrocarbon flow that are approximated over a discretized domain. A first governing equation for the hydrocarbon flow describing conservation of mass may be given by Equation 1.

$$\frac{\partial A}{\partial t} + \frac{\partial Q}{\partial x} = 0 \qquad (1)$$

In Equation 1, A is a cross-sectional area of the hydrocarbon flow, t is time, x is a spatial coordinate along the flow grid, and Q is a flow rate of the hydrocarbon flow. A second governing equation for conservation of momentum may be given by Equation 2.

$$\frac{\partial Q}{\partial t} + \frac{\partial (\phi)}{\partial x} + A\frac{\partial p}{\partial x} - \nu\frac{\partial^2 Q}{\partial x^2} = 0 \qquad (2)$$

In Equation 2, p is a pressure of the hydrocarbon flow, v is a viscosity of the hydrocarbon flow, and φ is an advection term given by $\varphi = Q^2/A$.

Different objectives of the discretization include obtaining a desired accuracy, while on the other hand, maintaining computational efficiency. The discretization may involve using a stencil having a defined length in nodes (or points) over a flow grid of nodes defining a discrete domain. A discretization operator described over the stencil is applied for each node in the flow grid and may result in a 1-dimensional system that governs the values for a given node. In other words, for each node, the stencil may define a number of variables that contribute to an approximation for a given node on each side of the given node along the flow grid. Advantages of using a smaller (or more condensed) stencil may include rapid calculation times for the discretization and increased likelihood of convergence of the solution for the hydrocarbon flow, also referred to as stability. However, using a smaller stencil may decrease an accuracy of the solution or may lead to greater errors in some instances.

As will be described in further detail herein, a method for simulating a hydrocarbon flow may involve approximating a derivative of the advection term φ using a Taylor series expressed in terms of a higher order derivative of the advection term. The higher order derivative of the advection term may be estimated, based on continuity assumptions of governing Equations 1 and 2, which is referred to herein as "re-normalization." In this manner, a reduction in an upper bound for an inaccuracy of the simulation, referred to as 'truncation error' may be achieved, while a relatively small stencil may be used for reduced calculation effort and reduced calculation times. Furthermore, in accordance with the disclosed embodiments, a stability of the simulation may be maintained.

In particular, at boundary nodes of the discrete domain, approximations of the governing Equations 1 and 2 may result in certain errors with larger stencils, because the stencil may extend to so-called "ghost nodes" that do not physically exist. Using the methods described herein for simulating a hydrocarbon flow, improved accuracy and stability of flow simulations may be achieved with adherence to the underlying governing equations but without the use of ghost nodes in regions outside of the discrete domain. Because the methods described herein for simulating a hydrocarbon flow do not rely on the use of ghost nodes, the use of interpolations and other kinds of approximations for regions outside the discrete domain, which may not be consistent with governing Equations 1 and 2, may be avoided. Furthermore, because the methods described herein for simulating a hydrocarbon flow do not involve assumptions for the regions outside of the discrete domain, such as periodicity, linearity, inverse linearity, reflection, etc., adverse effects and errors for every estimated node in the discrete domain may be prevented.

Furthermore, the methods described herein for simulating a hydrocarbon flow may enable the use of smaller stencils to achieve sufficiently high accuracy. The use of smaller stencils enabled by the methods described herein for simulating a hydrocarbon flow may maintain a stability of the solution for the hydrocarbon flow, and may, for example, prevent a simulated flow rate Q from attaining values inconsistent with a real, physical flow at some point in time.

Referring now to the drawings, FIG. 1A illustrates a cross-sectional view of an exemplary well system 100. FIG. 1A is a schematic representation of selected elements of an embodiment of well system 100 and is not drawn to scale. It will be understood that the present disclosure is applicable to different embodiments of well systems. Well system 100 may include wellbore 102 in subterranean region 104 beneath ground surface 106. Wellbore 102, as shown in FIG. 1A, may include a horizontal wellbore. However, well system 100 may include any combination of horizontal, vertical, slant, curved, or other wellbore orientations. Well system 100 may include one or more additional treatment wells, observation wells, or other types of wells. Subterranean region 104 may include a reservoir that contains hydrocarbon resources, such as oil or natural gas, or other natural resources, such as water. For example, subterranean region 104 may include all or part of a rock formation (e.g., shale, coal, sandstone, granite, or others) that contains natural gas. Subterranean region 104 may include naturally fractured rock or natural rock formations that are not fractured to any significant degree. Subterranean region 104 may include tight gas formations of low permeability rock (e.g., shale, coal, or others).

Well system 100 may also include injection system 108. In some embodiments, injection system 108 may perform a treatment, for example, by injecting fluid into subterranean region 104 through wellbore 102. In some embodiments, a treatment fractures part of a rock formation or other materials in subterranean region 104. In such examples, fracturing a rock may increase the surface area of a formation, which may increase the rate at which the formation conducts hydrocarbon resources to wellbore 102.

Injection system 108 may be used to perform one or more treatments including, for example, injection treatments or flow back treatments. For example, injection system 108 may apply treatments including single-stage injection treatments, multi-stage injection treatments, mini-fracture test treatments, follow-on fracture treatments, re-fracture treatments, final fracture treatments, other types of fracture treatments, or any suitable combination of treatments. An injection treatment may be, for example, a multi-stage injection treatment where an individual injection treatment is performed during each stage. A treatment may be applied at a single fluid injection location or at multiple fluid injection locations in a subterranean region, and fluid may be injected over a single time period or over multiple different time periods. In some instances, a treatment may use multiple different fluid injection locations in a single wellbore, multiple fluid injection locations in multiple different wellbores, or any suitable combination. Moreover, a treatment may inject fluid through any suitable type of wellbore, such as, for example, vertical wellbores, slant wellbores, horizontal wellbores, curved wellbores, or any suitable combination of these and others.

Injection system 108 may inject treatment fluid into subterranean region 104 through wellbore 102. Injection system 108 may include instrument truck 114, pump truck 116, and injection treatment control subsystem 111. Injection system 108 may include other features not shown in the figures. Although FIG. 1A depicts a single instrument truck 114 and a single pump truck 116, any suitable number of instrument trucks 114 and pump trucks 116 may be used. Although an embodiment with equipment on trucks is depicted for descriptive purposes with respect to FIG. 1A, it is noted that immobile installations with similar functionality may be used in different embodiments of well system 100.

Pump trucks 116 may communicate treatment fluids into wellbore 102, for example, through conduit 117, at or near the level of ground surface 106. Pump trucks 116 may include mobile vehicles, skids, hoses, tubes, fluid tanks, fluid reservoirs, pumps, valves, mixers, or other types of structures and equipment. Pump trucks 116 may supply treatment fluid or other materials for a treatment. Pump trucks 116 may contain multiple different treatment fluids, proppant materials, or other materials for different stages of a treatment. Treatment fluids may be communicated through wellbore 102 from ground surface 106 level by a conduit installed in wellbore 102. The conduit may include casing cemented to the wall of wellbore 102. In some embodiments, all or a portion of wellbore 102 may be left open, without casing. The conduit may include a working string, coiled tubing, sectioned pipe, or other types of conduit.

Instrument trucks 114 may include injection treatment control subsystem 111, which controls or monitors the treatment applied by injection system 108. Instrument trucks 114 may include mobile vehicles or other suitable structures. Injection treatment control subsystem 111 may control operation of injection system 108. Injection treatment control subsystem 111 may include data processing equipment, communication equipment, or other systems that control stimulation treatments applied to subterranean region 104 through wellbore 102. Injection treatment control subsystem 111 may include or be communicatively coupled to a computing system (e.g., computing subsystem 110) that calculates, selects, or optimizes treatment parameters for initialization, propagation, or opening fractures in subterranean region 104. Injection treatment control subsystem 111 may receive, generate or modify a stimulation treatment plan (e.g., a pumping schedule) that specifies properties of a treatment to be applied to subterranean region 104.

Injection system 108 may use multiple treatment stages or intervals, such as stage 118a and stage 118b (collectively "stages 118"). Injection system 108 may delineate fewer stages or multiple additional stages beyond the two exemplary stages 118 shown in FIG. 1A. Stages 118 may each have one or more perforation clusters 120 that include one or more perforations 138. Fractures in subterranean region 104 may be initiated at or near perforation clusters 120 or elsewhere. Stages 118 may have different widths or may be uniformly distributed along wellbore 102. Stages 118 may be distinct, nonoverlapping (or overlapping) injection zones along wellbore 102. In some embodiments, each stage 118 may be isolated from other stages 118, for example, by packers or other types of seals in wellbore 102. In some embodiments, each stage 118 may be treated individually, for example, in series along wellbore 102. Injection system 108 may perform identical, similar, or different injection treatments at different stages 118.

A treatment, along with other activities and natural phenomena, may generate microseismic events in subterranean region 104. For example, injection system 108 may cause multiple microseismic events 132 during a multi-stage injection treatment. Microseismic event data may be collected from subterranean region 104. Microseismic event data detected in well system 100 may be generated from acoustic signals of natural phenomena, acoustic signals associated with a stimulation treatment applied through wellbore 102, or other types of signals. For instance, sensors 136 may detect acoustic signals generated by rock slips, rock movements, rock fractures or other events in subterranean region 104. In some instances, the locations of individual microseismic events may be determined based on the microseismic event data. Microseismic events in subterranean region 104 may occur, for example, along or near induced hydraulic fractures. The microseismic events may be associated with pre-existing natural fractures or hydraulic fracture planes induced by fracturing activities. Microseismic event data from a stimulation treatment may include information collected before, during, or after fluid injection.

Wellbore 102 may include sensors 136, microseismic array, and other equipment that may be used to detect the acoustic signals and to generate the microseismic event data. Sensors 136 may include geophones or other types of listening equipment. Sensors 136 may be located at a variety of positions in well system 100. In some embodiments, computing subsystem 110 may be configured to identify subset 134 of microseismic events 132 associated with a single treatment stage (e.g., treatment stage 118a) of a multi-stage injection treatment. For example, subset 134 of microseismic events 132 are shown inside a circle in FIG. 1A. In some embodiments, subset 134 of microseismic events 132 may be identified based on a time that they occurred, and subset 134 may be filtered or otherwise modified to exclude outliers or other event points. Subset 134 of microseismic events 132 may be selected from a superset of microseismic events 132 based on any suitable criteria. In some cases, subset 134 of microseismic events 132 may be used to identify an SRV associated with a particular stage of a treatment, such as stage 118a.

As shown in FIG. 1A, sensors 136 may be installed at surface 106 and beneath surface 106 (e.g., in an observation well (not shown)). Additionally or alternatively, sensors 136 may be positioned in other locations above or below ground surface 106, in other locations within wellbore 102, or within another associated wellbore (e.g., another treatment well or an observation well). Wellbore 102 may include additional equipment (e.g., working string, packers, casing, or other equipment) not shown in FIG. 1A.

Sensors 136 or other detecting equipment in well system 100 may detect the microseismic events, and collect and transmit the microseismic event data, for example, to computing subsystem 110. In the embodiment shown in FIG. 1A, computing subsystem 110 may be located above ground surface 106. In various embodiments, computing subsystem 110 may include one or more computing devices or systems located at the wellbore 102, or in other locations. In some embodiments, at least a portion of computing subsystem 110 may be located apart from the other components shown in FIG. 1A. For example, computing subsystem 110 may be located at a data processing center, a computing facility, or another suitable location. In some cases, all or part of computing subsystem 110 may be contained in a technical command center at a well site, in a real-time operations center at a remote location, in another appropriate location, or any suitable combination thereof.

Computing subsystem 110 may receive and analyze microseismic event data. For example, computing subsystem 110 may analyze microseismic event data from a stimulation treatment of subterranean region 104. Computing subsystem 110 may receive microseismic event data at any suitable time. In some instances, computing subsystem 110 may receive microseismic event data in real time (or substantially in real time) during a treatment. For example, microseismic event data may be sent to computing subsystem 110 upon detection by sensors 136. In some instances, computing subsystem 110 receives some or all of the microseismic event data after a fracture treatment has been completed. Computing subsystem 110 may receive the microseismic event data in any suitable format. For example, computing subsystem 110 may receive the microseismic event data in a format produced by microseismic sensors or detectors, or computing subsystem 110 may receive microseismic event data after formatting, packaging, or other types of processing on the microseismic event data has been performed. Computing subsystem 110 may receive microseismic event data, for example, by a wired or wireless communication link, by a wired or wireless network, or by one or more disks or other tangible media.

In some embodiments, computing subsystem 110 may identify an SRV for a treatment based on microseismic event data. The SRV may be computed for an individual stage or for a multistage treatment as a whole. In some instances, the computed SRV may be presented to users to visualize and analyze the temporal and spatial evolution of the SRV. In some implementations, microseismic event data may be collected, communicated, and analyzed in real time during an injection treatment. In some implementations, a computed SRV may be provided to injection treatment control subsystem 111. A current or a prospective treatment strategy may be adjusted or otherwise managed based on a computed SRV data, for example, to improve the efficiency of the injection treatment.

Computing subsystem 110 may be configured to perform additional or different operations. Computing subsystem 110 may perform, for example, fracture mapping and matching based on collected microseismic event data to identify fracture orientation trends and extract fracture network characteristics. These characteristics may include fracture orientation (e.g., azimuth and dip angle), fracture size (e.g., length, height, surface area), fracture spacing, fracture complexity, or another property. In some implementations, computing subsystem 110 may identify an SRV for a stimulation treatment applied to subterranean region 104, identify an overlapping volume of SRVs between stages of a stimulation treatment, or other information.

Well system 100 and computing subsystem 110 may include or access any suitable communication infrastructure. Communication links 128 may allow instrument trucks 114 to communicate with pump trucks 116, or other equipment at ground surface 106. Additional communication links may allow instrument trucks 114 to communicate with sensors or data collection apparatus in well system 100, remote systems, other well systems, equipment installed in wellbore 102 or other devices and equipment. For example, well system 100 may include multiple separate communication links or a network of interconnected communication links. These communication links may include wired or wireless communications systems. For example, sensors 136 may communicate with instrument trucks 114 or computing subsystem 110 through wired or wireless links or networks, or instrument trucks 114 may communicate with computing subsystem 110 through wired or wireless links or networks. These communication links may include a public data network, a private data network, satellite links, dedicated communication channels, telecommunication links, or any suitable combination of these and other communication links.

Well system 100 may include additional or different features, and the features of well system 100 may be arranged as shown in FIG. 1A, or in another suitable configuration. Some of the techniques and operations described herein may be implemented by a computing subsystem configured to provide the functionality described. In various embodiments, a computing system may include any of various types of devices, including, but not limited to, personal computer systems, desktop computers, laptops, notebooks, mainframe computer systems, handheld computers, workstations, tablets, application servers, storage devices, computing clusters, or any type of computing or electronic device.

Figure 1B:
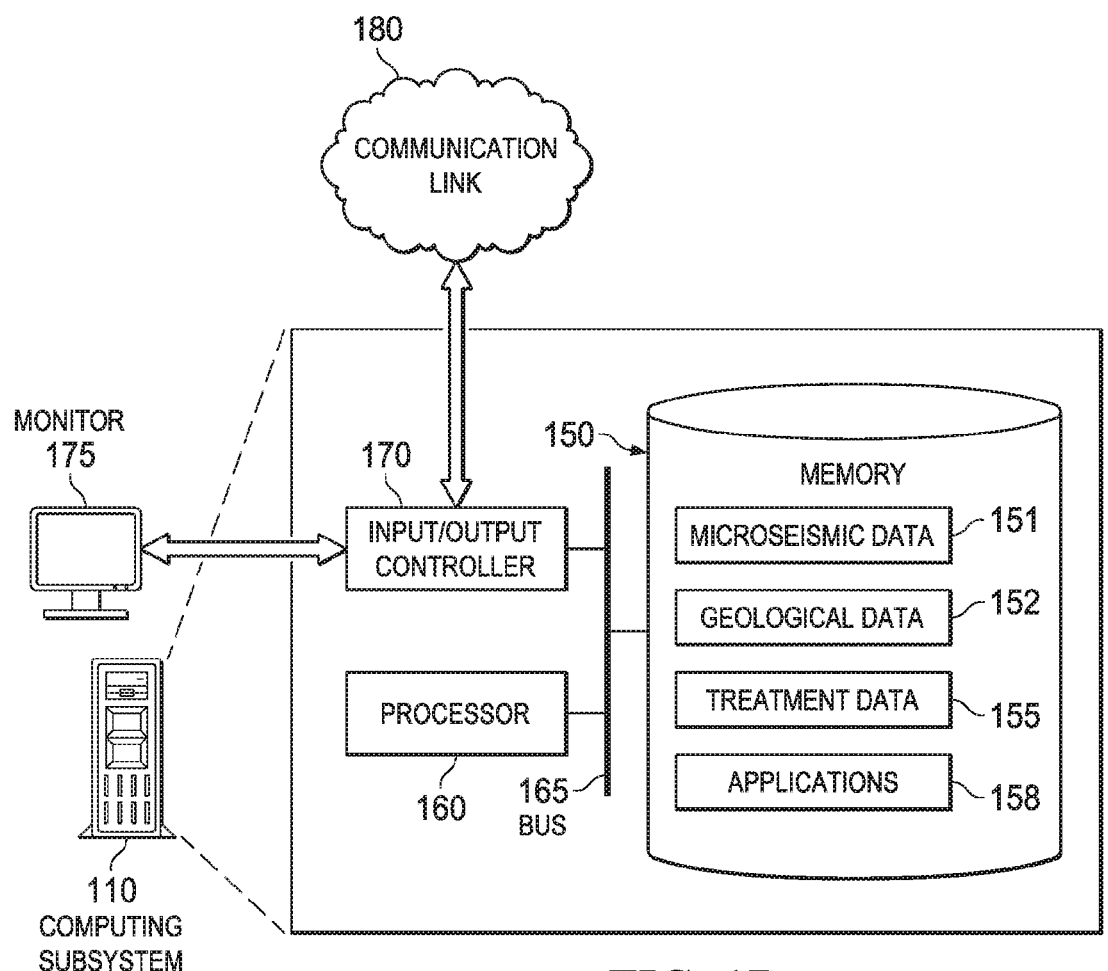
FIG. 1B illustrates a block diagram of an exemplary computing subsystem of FIG. 1A.

Referring now to FIG. 1B, an exemplary computing subsystem 110 of FIG. 1A, in accordance with some embodiments of the present disclosure, is depicted. Computing subsystem 110 may be located at or near one or more wellbores of well system 100 or at a remote location. All or part of computing subsystem 110 may operate as a component of or independent of well system 100 or independent of any other components shown in FIG. 1A. Computing subsystem 110 may include memory 150, processor 160, and input/output controllers 170 communicatively coupled by bus 165.

Processor 160 may include hardware for executing instructions, such as those making up a computer program, such as any one of applications 158. As an example and not by way of limitation, to execute instructions, processor 160 may retrieve (or fetch) the instructions from an internal register, an internal cache, memory 150; decode and execute them; and then write one or more results to an internal register, an internal cache, memory 150. In some embodiments, processor 160 may execute instructions, for example, to generate output data based on data inputs. For example, processor 160 may run application 158 by executing or interpreting software, scripts, programs, functions, executables, or other modules contained in application 158. Processor 160 may perform one or more operations related to FIGS. 2A, 2B, 3A, 3B, 4A, 4B, 5 and 6. Input data received by processor 160 or output data generated by processor 160 may include microseismic data 151, geological data 152, or other data.

Memory 150 may include, for example, random access memory (RAM), a storage device (e.g., a writable read-only memory (ROM) or others), a hard disk, a solid state storage device, or another type of storage medium. Computing subsystem 110 may be preprogrammed or it may be programmed (and reprogrammed) by loading a program from another source (e.g., from a CD-ROM, from another computer device through a data network, or in another manner). In some embodiments, input/output controller 170 may be coupled to input/output devices (e.g., monitor 175, a mouse, a keyboard, or other input/output devices) and to communication link 180. The input/output devices may receive and transmit data in analog or digital form over communication link 180.

Memory 150 may store instructions (e.g., computer code) associated with an operating system, computer applications, and other resources. Memory 150 may also store application data and data objects that may be interpreted by one or more applications or virtual machines running on computing subsystem 110. Memory 150 may include microseismic data 151, geological data 152, and applications 158. In some implementations, a memory of a computing device may include additional or different data, applications, models, or other information.

Microseismic data 151 may include information for microseismic events in a subterranean region, such as the microseismic event data described above. For example, with regard to FIG. 1A, microseismic data 151 may include information based on acoustic data collected by sensors 136 at wellbore 102, at surface 106, or at other locations within subterranean region 104. In some embodiments, microseismic data 151 may include information that has been combined with other data, reformatted, or otherwise processed. Microseismic data 151 may include any suitable information relating to microseismic events (e.g., locations, times, magnitudes, moments, uncertainties, etc.). Microseismic data 151 may include data collected from one or more stimulation treatments, which may include data collected before, during, or after a fluid injection.

Geological data 152 may include information on geological properties of subterranean region 104. For example, with regard to FIG. 1A, geological data 152 may include information on wellbore 102, or information on other attributes of subterranean region 104. In some embodiments, geological data 152 may include information on lithology, fluid content, stress profile, pressure profile, spatial extent, or other attributes of one or more rock formations in subterranean region 104. Geological data 152 may further include information collected from well logs, rock samples, outcroppings, microseismic imaging, or other data sources.

Treatment data 155 may include information on properties of a planned treatment of subterranean region 104. For example, with regard to FIG. 1A, treatment data 155 may include information identifying locations of perforations 138. In some embodiments, treatment data 155 may include information on a pumping schedule for a treatment stage, such a fluid volume, fluid pumping rate, or fluid pumping pressure.

Applications 158 may include software applications, scripts, programs, functions, executables, or other modules that may result in code or instructions that are executed by processor 160. The applications 158 may include computer-readable instructions for performing one or more operations related to FIGS. 2A, 2B, 3A, 3B, 4A, 4B, 5 and 6. Applications 158 may obtain input data, such as treatment data 155, geological data 152, microseismic data 151, or other types of input data, from memory 150, from another local source, or from one or more remote sources (e.g., via communication link 180). Applications 158 may generate output data and store output data in memory 150, in another local medium, or in one or more remote devices (e.g., by sending output data via communication link 180). Applications 158 may include computer-readable instructions for generating a user interface or a plot, for example, illustrating fracture geometry (e.g., length, width, spacing, orientation, etc.), geometric representations of an SRV, an SRV overlap, SRV uncertainty, etc. Applications 158 may include higher order simulation of hydrocarbon flows to evaluate a production viability of a particular well site or subterranean formation for a hydraulic fracturing process.

Communication link 180 may include any type of communication channel, connector, data communication network, or other link. For example, communication link 180 may include a wireless or a wired network, a Local Area Network (LAN), a Wide Area Network (WAN), a private network, a public network (such as the Internet), a WiFi network, a network that includes a satellite link, a serial link, a wireless link (e.g., infrared, radio frequency, or others), a parallel link, or another type of data communication network.

In some implementations, microseismic event data may be collected from a stimulation treatment, such as a multi-stage hydraulic fracturing treatment. Based on locations of the microseismic events in a subterranean region, a geometrical representation of the SRV may be constructed, and a quantitative representation of a SRV may be calculated based on the geometrical representation. A geometrical representation may include plots, tables, charts, graphs, coordinates, vector data, maps or other geometrical objects. In some implementations, in addition to a volume of the calculated SRV for a stimulated subterranean region, other geometric properties (e.g., a length, width, height, orientation) of an SRV may be identified based on a geometrical representation. Geometric properties may be used to characterize a stimulated subterranean region. For example, a geometrical representation may indicate an extension of hydraulic fractures in a stimulated subterranean formation, which may be used to estimate a production capacity within the formation, including estimated values for hydrocarbon flow from the formation.

Higher order simulation of hydrocarbon flows associated with complex fractures produced in the hydraulic fracturing process may be used to obtain high fidelity results while minimizing a cost of computation. The simulation of the hydrocarbon flow may be performed using a discretization technique. However, a higher order discretization near a boundary of a discrete domain may be constrained by a lack of ability of the computational nodes to enable discretization. As disclosed herein, a re-normalization technique may be used to implement higher-order finite difference/finite volume discretization near the boundary of the discrete domain. The higher order simulation of hydrocarbon flows using the re-normalization technique disclosed herein may provide efficient and stable simulation algorithms that avoid any artificial boundary treatment inconsistent with the governing equations, while maintaining a uniform order of accuracy. The re-normalization technique disclosed herein may avoid the use of one-sided stencils that may adversely affect a bandwidth of the 1-dimensional system and stability of a discretization algorithm. The re-normalization technique disclosed herein may avoid utilizing lower order schemes near the boundaries that undesirably reduce accuracy. The re-normalization technique disclosed herein may avoid utilizing ghost nodes with approximations that may be invalid over the entire domain.

Referring now to FIG. 2A, a discretization 200 of a domain of interest includes nodes 202 and a domain 204, shown as a bounded shaded region of interest. Although discretization 200 is shown in a 2-dimensional flow grid for descriptive clarity, it will be understood that discretization 200 may include various dimensions, such as 1-dimensional flow grids and 3-dimensional flow grids. It is noted that, in some embodiments, domain 204 may represent an SRV.

In FIG. 2A, domain 204 may represent a bounded region of interest where a flow simulation is desired. The discretization is performed using discrete nodes 202 lying within domain 204. Nodes 202 lying outside and close to the boundary of domain 204 are ghost nodes that do not satisfy governing Equations 1 and 2. The discretization operator described over the stencil may extend beyond beyond domain 204, near the boundary. Using re-normalization, a higher order estimation of a desired quantity of the hydrocarbon flow from domain 204 may be computed using a Taylor series expansion in conjunction with the governing equation describing the hydrocarbon flow. In this manner, the governing equations remain satisfied up to the boundary while retaining a uniform order of accuracy throughout the domain.

In FIG. 2B, hydraulic fractures 201 are represented by a set or a graph of 1-dimensional hydrocarbon flows. In the following description, a 1-dimensional representation of hydrocarbon flows may be assumed within domain 204. The 1-dimensional hydrocarbon flows may be combined to estimate overall hydrocarbon flow for hydraulic fractures 201. Because of continuity assumptions for governing Equations 1 and 2, first order and higher order approximations of derivatives on a staggered structured or unstructured flow grid may be obtained. Thus, the equations for the 1-dimensional representation of hydrocarbon flows, as described in further detail herein, may be an elemental flow simulation that is combined to estimate flows in domain 204, which may be represented as a combination of 1-dimensional flows.

In FIG. 3A, arrangement of flow variables, Q, A, and p on a staggered flow grid 300 is illustrated. Staggered flow grid 300 represents a 1-dimensional spatial axis for a hydrocarbon flow. In staggered flow grid 300, flow variables A and p may be defined on alternating star nodes, while flow variable Q may be defined on alternating square nodes.

FIG. 3B illustrates ordering 301 of nodes on staggered flow grid 300.

Equation 1 may be discretized on alternating star nodes, while Equation 2 may be discretized on alternating square nodes to obtain second order accuracy in space.

In general equations with nonlinear advection terms may involve directional discretization, referred to as "upwinding," where the stencil of the approximation depends on the flow direction, resulting in a left-biased stencil and a right-biased stencil. In particular, higher order directional discretization of the advection term close to the boundary of the SRV may depend on information from nodes crossing either the left-biased stencil or the right-biased stencil. In such instances, the advection term may be expressed in terms of a Taylor series expansion up to a desired order of accuracy, about a left side or a right side of the node, which is referred to as "one sided." The higher order derivative appearing in the Taylor series may then be $$\frac{A_{i-1/2}^{n+1} - A_{i-1/2}^{n}}{\Delta t} + \theta\left(\frac{Q_i^{n+1} - Q_{i-1}^{n+1}}{\Delta x}\right) + (1-\theta)\left(\frac{Q_i^{n} - Q_{i-1}^{n}}{\Delta x}\right) = 0 \quad (3)$$

reconstructed using governing Equations 1 and 2, which is the re-normalization method. Discretization of Equation 1 at node $i-1/2$ in ordering 301 may be given by Equation 3. Discretization of Equation 2 at node i in ordering 301 may be given by Equation 4.

$$\frac{Q_i^{n+1} - Q_i^{n}}{\Delta t} + \theta\left\{\frac{\partial (Q^2/A)_i^{n+1}}{\partial x} + \left(\frac{A_{i-1/2}^{n+1} + A_{i+1/2}^{n+1}}{2}\right)\frac{P_{i+1/2}^{n+1} - P_{i-1/2}^{n+1}}{\Delta x} - v\frac{Q_{i+1}^{n+1} - 2Q_i^{n+1} + Q_{i-1}^{n+1}}{\Delta x^2}\right\} + (1-\theta)\left\{\frac{\partial (Q^2/A)_i^{n}}{\partial x} + \left(\frac{A_{i-1/2}^{n} + A_{i+1/2}^{n}}{2}\right)\frac{P_{i+1/2}^{n} - P_{i-1/2}^{n}}{\Delta x} - v\frac{Q_{i+1}^{n} - 2Q_i^{n} + Q_{i-1}^{n}}{\Delta x^2}\right\} = 0. \quad (4)$$

In Equations 3 and 4, n is a time slice of time t for time iteration, and i is a position along staggered grid 300. In Equations 3 and 4, θ is a time integration scheme for defining a time integration window and may have values $0 \leq \theta \leq 1$, where particular values of θ include: θ=0, current time slice n (forward difference, full explicit, first order in time); θ=1/2, half way to next time slice n (Crank-Nicolson, second order in time); and θ=1, next time slice n (Backward Euler, first order in time).

A finite difference upwind scheme to the advection term may use one-sided approximation of the derivative for interior nodes. For the second order upwind scheme the derivative of φ may be approximated using a piecewise 1-dimensional solution. In other words, the derivative may be approximated by a second order accurate one-sided finite difference (3 point stencil) formula given by Equation 4a.

$$\frac{\partial (Q^2/A)_i^{n+1}}{\partial x} = \quad (4a)$$

$$\begin{cases} \left\{\frac{3(Q^2/A)_i^{n+1} - 4(Q^2/A)_{i-1}^{n+1} + (Q^2/A)_{i-2}^{n+1}}{2\Delta x}\right\}, & (Q/A)_i^n > 0 \\ \left\{\frac{-(Q^2/A)_{i+2}^{n+1} + 4(Q^2/A)_{i+1}^{n+1} - 3(Q^2/A)_i^{n+1}}{2\Delta x}\right\}, & (Q/A)_i^n < 0 \end{cases}$$

In Equation 4a, $\varphi_i^n$ may represent the value of φ at a flow grid node i at time $t=t_n$.

In a finite volume approximation, $\varphi_i^n$ may represent a cell average of a finite volume cell, while the value of $\varphi_i^n$ at the interface is determined by the cell value on the upwind side.

Figure 4A:
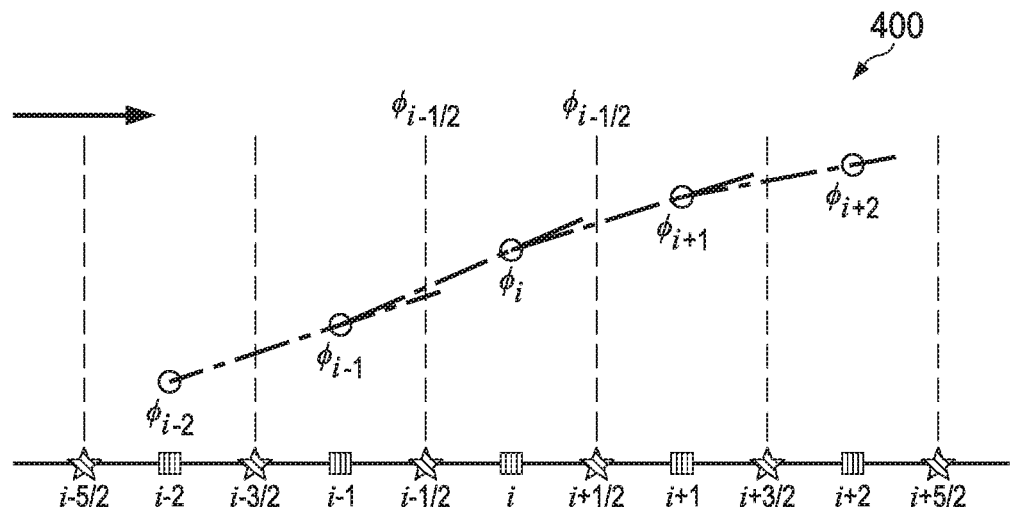
FIGS. 4A and 4B illustrate plots of a finite volume approximation of an upwind scheme.
Figure 4B:
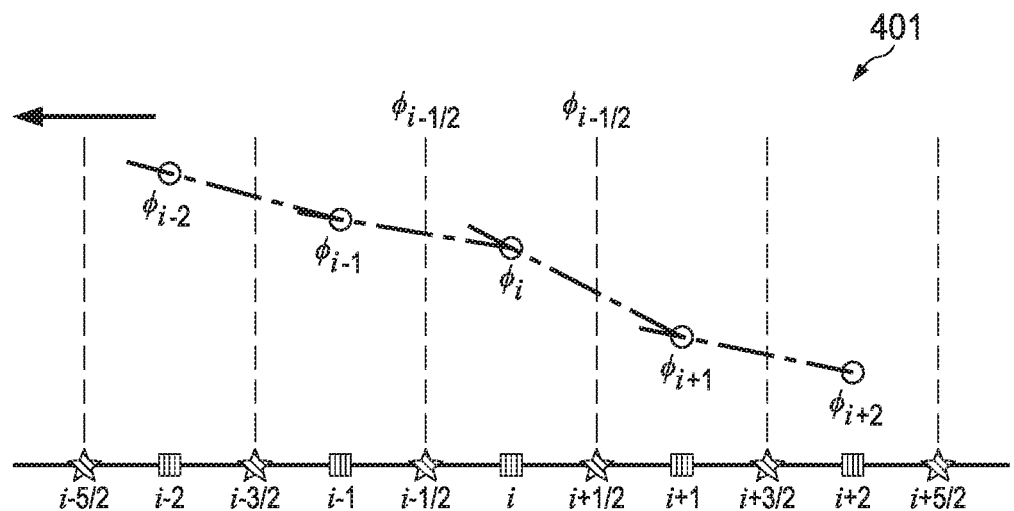

In FIG. 4A, a finite volume approximation 400 of the upwind scheme is shown in which $\varphi_i^n$ is seen as a cell average over the $i^{th}$ cell of a case where $(Q/A)>0$. In FIG. 4B, a finite volume approximation 401 of the upwind scheme is shown in which $\varphi_i^n$ is seen as a cell average over the $i^{th}$ cell of a case where $(Q/A)<0$. The piecewise 1-dimensional approximations of $\varphi_i^n$ over each cell may result in a second-order accurate upwind finite volume scheme as given by Equation 4b.

$$\frac{\partial (Q^2/A)_i^{n+1}}{\partial x} = \frac{(Q^2/A)_{i+1/2}^{n+1} - (Q^2/A)_{i-1/2}^{n+1}}{\Delta x}, \text{ where} \quad (4b)$$

$$(Q^2/A)_{i+1/2}^{n+1} = \begin{cases} \left(\frac{3(Q^2/A)_i^{n+1} - (Q^2/A)_{i-1}^{n+1}}{2\Delta x}\right), & (Q/A)_{i+1/2}^n > 0 \\ \left(\frac{3(Q^2/A)_{i+1}^{n+1} - (Q^2/A)_{i+2}^{n+1}}{2\Delta x}\right), & (Q/A)_{i+1/2}^n < 0 \end{cases}$$

$$(Q^2/A)_{i-1/2}^{n+1} = \begin{cases} \left(\frac{3(Q^2/A)_{i-1}^{n+1} - (Q^2/A)_{i-2}^{n+1}}{2\Delta x}\right), & (Q/A)_{i+1/2}^n > 0 \\ \left(\frac{3(Q^2/A)_i^{n+1} - (Q^2/A)_{i+1}^{n+1}}{2\Delta x}\right), & (Q/A)_{i-1/2}^n < 0 \end{cases}$$

The 1-dimensional upwind finite volume scheme in Equation 4b may be second order accurate and may be equivalent to the one-sided second order accurate finite difference formula (3 point stencil) in Equation 4a.

For interior nodes, the second order upwind discretization for the advection term in finite difference may be given by Equation 5.

$$\frac{\partial (Q^2/A)_i^{n+1}}{\partial x} = \alpha^+ \left\{\frac{3(Q^2/A)_i^{n+1} - 4(Q^2/A)_{i-1}^{n+1} + (Q^2/A)_{i-2}^{n+1}}{2\Delta x}\right\} + \quad (5)$$

$$\alpha^- \left\{\frac{-(Q^2/A)_{i+2}^{n+1} - 4(Q^2/A)_{i+1}^{n+1} - 3(Q^2/A)_i^{n+1}}{2\Delta x}\right\}, \text{ where}$$

$$\alpha^+ = \text{ABS}\left(\text{SIGN}\left(\text{MAX}\left(0, \frac{2Q_i^n}{A_{i+1/2}^n + A_{i-1/2}^n}\right)\right)\right); \quad (5)$$

$$\alpha^- = \text{ABS}\left(\text{SIGN}\left(\text{MIN}\left(0, \frac{2Q_i^n}{A_{i+1/2}^n + A_{i-1/2}^n}\right)\right)\right).$$

For interior nodes, the second order upwind discretization for the advection $$\frac{\partial (Q^2/A)_i^{n+1}}{\partial x} = \frac{(Q^2/A)_{i+1/2}^{n+1} - (Q^2/A)_{i-1/2}^{n+1}}{\Delta x} = \quad (6)$$

-continued $$\left\{\begin{array}{l}\alpha_R^+\left(\frac{3(Q^2/A)_i^{n+1}-(Q^2/A)_{i-1}^{n+1}}{2\Delta x}\right)+\alpha_R^-\left(\frac{3(Q^2/A)_{i+1}^{n+1}-(Q^2/A)_{i+2}^{n+1}}{2\Delta x}\right)\\-\alpha_L^+\left(\frac{3(Q^2/A)_{i-1}^{n+1}-(Q^2/A)_{i-2}^{n+1}}{2\Delta x}\right)-\alpha_L^-\left(\frac{3(Q^2/A)_i^{n+1}-(Q^2/A)_{i+1}^{n+1}}{2\Delta x}\right)\end{array}\right\},\quad 5$$

term in finite volume may be given by Equation 6.

$$\alpha_R^+ = \mathrm{ABS}\left(\mathrm{SIGN}\left(\mathrm{MAX}\left(0,\frac{(Q_i^n+Q_{i+1}^n)}{2A_{i+1/2}^n}\right)\right)\right); \quad (6)$$

$$\alpha_R^- = \mathrm{ABS}\left(\mathrm{SIGN}\left(\mathrm{MIN}\left(0,\frac{(Q_i^n+Q_{i+1}^n)}{2A_{i+1/2}^n}\right)\right)\right) \&$$

$$\alpha_L^+ = \mathrm{ABS}\left(\mathrm{SIGN}\left(\mathrm{MAX}\left(0,\frac{(Q_{i-1}^n+Q_i^n)}{2A_{i-1/2}^n}\right)\right)\right);$$

$$\alpha_L^- = \mathrm{ABS}\left(\mathrm{SIGN}\left(\mathrm{MIN}\left(0,\frac{(Q_{i-1}^n+Q_i^n)}{2A_{i-1/2}^n}\right)\right)\right).$$

When the stencils extend beyond a boundary of the discrete domain, also referred to as the "domain extent," it may not be possible to implement the second order upwind discretization for boundary nodes at the boundary. However, in order to maintain accuracy of the boundary nodes, the directional discretization up to second order accuracy may obtained for the boundary nodes using the re-normalization technique, which is based on a Taylor series expansion. It is noted that the re-normalization technique is not limited to the boundary nodes, but may be used for any nodes within the discrete domain.

FIG. 5 shows a node i where the second order discretization crosses the domain extent of a domain boundary and a second order accurate Taylor series is used in flow grid 500. A one-sided Taylor series expansion of $\varphi_i$ leads to the following expressions for the one-sided first derivative, shown as Equations 7.

$$\phi_{i-1} = \phi_i - \Delta x \frac{\partial \phi_i}{\partial x} + \frac{\Delta x^2}{2}\frac{\partial^2 \phi_i}{\partial x^2} - \frac{\Delta x^3}{6}\frac{\partial^3 \phi_i}{\partial x^3} + o(\Delta x^4); \quad (7)$$

$$\frac{\partial \phi_i^-}{\partial x} = \frac{\phi_i - \phi_{i-1}}{\Delta x} + \frac{\Delta x}{2}\frac{\partial^2 \phi_i}{\partial x^2} + o(\Delta x^2)$$

$$\phi_{i+1} = \phi_i + \Delta x \frac{\partial \phi_i}{\partial x} + \frac{\Delta x^2}{2}\frac{\partial^2 \phi_i}{\partial x^2} + \frac{\Delta x^3}{6}\frac{\partial^3 \phi_i}{\partial x^3} + o(\Delta x^4);$$

$$\frac{\partial \phi_i^+}{\partial x} = \frac{\phi_{i+1} - \phi_i}{\Delta x} - \frac{\Delta x}{2}\frac{\partial^2 \phi_i}{\partial x^2} + o(\Delta x^2)$$

The finite difference upwind discretization of the advection term for the boundary node is given by Equation 7A.

$$\frac{\partial (Q^2/A)_i^{n+1}}{\partial x} = \alpha^+\left(\frac{\partial \phi_i^-}{\partial x}\right)^{n+1} + \alpha^-\left(\frac{\partial \phi_i^+}{\partial x}\right)^{n+1}. \quad (7A)$$

The second derivatives appearing in Equations 7 and 7A may be approximated and substituted using momentum conservation governing Equation 2, as given by Equation 8, which represents the re-normalization. The substitution is valid based on the continuity assumption for Equation 2.

$$\frac{\partial^2 (Q^2/A)_i^-}{\partial x^2} = \frac{\frac{\partial \phi_i^-}{\partial x} - \frac{\partial \phi_{i-1}^-}{\partial x}}{\Delta x} = \quad (8)$$

$$v\frac{\partial^2 Q}{\partial x^2} - A\frac{\partial p}{\partial x} - \frac{\partial Q}{\partial t}\text{(it can written as: }vQ_{xx} - Ap_x - Q_t\text{)}.$$

Using the Taylor series expansion given by Equation 7 and using the re-normalization given by Equation 8, the finite difference discretization for the advection term may be given by Equations 9a and 9b.

$$\frac{\partial (Q^2/A)_i^{n+1}}{\partial x} = \alpha^+\left\{\frac{(Q^2/A)_i^{n+1}-(Q^2/A)_{i-1}^{n+1}}{\Delta x} + \right. \quad (9a)$$

$$\left.\frac{\Delta x}{2}(Q^2/A)_{xx,i}^{n+1} + o(\Delta x^2)\right\} +$$

$$\alpha^-\left\{\frac{(Q^2/A)_{i+1}^{n+1}-(Q^2/A)_i^{n+1}}{\Delta x} - \right.$$

$$\left.\frac{\Delta x}{2}(Q^2/A)_{xx,i}^{n+1} + o(\Delta x^2)\right\}$$

$$= \alpha^+\left\{\frac{(Q^2/A)_i^{n+1}-(Q^2/A)_{i-1}^{n+1}}{\Delta x} + \right.$$

$$\left.\frac{\Delta x}{2}\frac{(Q^2/A)_{x,i}^{n+1}-(Q^2/A)_{x,i-1}^{n+1}}{\Delta x} + o(\Delta x^2)\right\} +$$

$$\alpha^-\left\{\frac{(Q^2/A)_{i-1}^{n+1}-(Q^2/A)_i^{n+1}}{\Delta x} - \right.$$

$$\left.\frac{\Delta x}{2}\frac{(Q^2/A)_{x,i+1}^{n+1}-(Q^2/A)_{x,i}^{n+1}}{\Delta x} + o(\Delta x^2)\right\}$$

$$= \alpha^+\left\{\frac{(Q^2/A)_i^{n+1}-(Q^2/A)_{i-1}^{n+1}}{\Delta x} + \right. \quad (9b)$$

$$\left.\frac{\Delta x}{2}\frac{(vQ_{xx}-Ap_x-Q_t)_i^{n+1}-(vQ_{xx}-Ap_x-Q_t)_{i-1}^{n+1}}{\Delta x} + \right.$$

$$\left.o(\Delta x^2)\right\} +$$

$$\alpha^-\left\{\frac{(Q^2/A)_{i+1}^{n+1}-(Q^2/A)_i^{n+1}}{\Delta x} - \right.$$

$$\left.\frac{\Delta x}{2}\frac{(vQ_{xx}-Ap_x-Q_t)_{i+1}^{n+1}-(vQ_{xx}-Ap_x-Q_t)_i^{n+1}}{\Delta x} + \right.$$

$$\left.o(\Delta x^2)\right\}.$$

Similarly, re-normalization using the finite volume discretization may be given by Equation 10.

$$\frac{\partial (Q^2/A)_i^{n+1}}{\partial x} = \frac{(Q^2/A)_{i+1/2}^{n+1}-(Q^2/A)_{i-1/2}^{n+1}}{\Delta x} \quad (10)$$

$$= \frac{1}{\Delta x}\left\{\begin{array}{l}\alpha_R^+\left((Q^2/A)_i^{n+1}+\frac{\Delta x}{2}(Q^2/A)_{x,i}^{n-1}\right)+\\ \alpha_R^-\left((Q^2/A)_{i+1}^{n+1}-\frac{\Delta x}{2}(Q^2/A)_{x,i+1}^{n+1}\right)\\ -\alpha_L^+\left((Q^2/A)_{i-1}^{n+1}+\frac{\Delta x}{2}(Q^2/A)_{x,i-1}^{n+1}\right)-\\ \alpha_L^-\left((Q^2/A)_i^{n+1}-\frac{\Delta x}{2}(Q^2/A)_{x,i}^{n+1}\right)\end{array}\right\}.$$

The re-normalized advection term using the finite volume discretization may be given by Equation 11.

$$\frac{\partial (Q^2/A)_i^{n+1}}{\partial x} = \frac{1}{\Delta x}\left\{\begin{array}{l}\alpha_R^+\left((Q^2/A)_i^{n+1} + \frac{\Delta x}{2}(vQ_{xx} - Ap_x - Q_t)_i^{n+1}\right) + \\ \alpha_R^-\left((Q^2/A)_{i+1}^{n+1} - \frac{\Delta x}{2}(vQ_{xx} - Ap_x - Q_t)_{i+1}^{n+1}\right) \\ -\alpha_L^+\left((Q^2/A)_{i-1}^{n+1} + \frac{\Delta x}{2}(vQ_{xx} - Ap_x - Q_t)_{i-1}^{n+1}\right) - \\ \alpha_L^-\left((Q^2/A)_i^{n+1} - \frac{\Delta x}{2}(vQ_{xx} - Ap_x - Q_t)_i^{n+1}\right)\end{array}\right\} \quad (11)$$

For the re-normalization procedure, the order of accuracy in space may be verified using the Method of Manufactured Solutions (MMS). Using the exact solutions given by Equations 12, the error norm computed at t=0.1 under the finite difference discretization for the Backward Euler time integration is listed in Table 1, where N denotes a number of nodes in the domain.

$$Q = \frac{1}{12}x(6(x-2)\sin(t) - 4(x^2+3) + 3x(x^3+2)); \; p = \cos(t)\sin(2\pi x) \quad (12)$$

TABLE 1

Error norm in space using re-normalization with Backward Euler

| N | $L_\infty(Q)$ | o(Q) | $L_\infty(p)$ | o(p) |
|---|---|---|---|---|
| 50 | 2.78E−04 | | 5.11E+00 | |
| 100 | 6.80E−05 | 2.03 | 1.31E+00 | 1.97 |
| 200 | 1.68E−05 | 2.01 | 3.30E−01 | 1.98 |
| 400 | 4.19E−06 | 2.01 | 8.30E−02 | 1.99 |
| 800 | 1.04E−06 | 2.00 | 2.08E−02 | 2.00 |

Using the second order re-normalization procedure, the error near the boundary may be observed to be smaller as compared to a first order discretization near the boundary.

The implementation of the re-normalization procedure for a given value of θ may involve certain judicious choices of operations. The time derivative appearing due to re-normalization in Equation 11 may first be combined with the time derivative in Equation 4 before assigning a value to θ. Then, a re-normalized momentum equation for a generalized time integration scheme may be given by Equation 13.

$$\frac{Q_i^{n+1} - Q_i^n}{\Delta t} + \frac{\alpha_R^+(-Q_t)_i^{n+1} + \alpha_R^-(-Q_t)_{i+1}^{n+1} - \alpha_L^+(-Q_t)_{i-1}^{n+1} - \alpha_L^-(-Q_t)_i^{n+1}}{\Delta x} + $$

$$\theta\left\{\frac{1}{\Delta x}\left\{\begin{array}{l}\alpha_R^+\left((Q^2/A)_i^{n+1} + \frac{\Delta x}{2}(vQ_{xx} - Ap_x)_i^{n+1}\right) + \\ \alpha_R^-\left((Q^2/A)_{i+1}^{n+1} - \frac{\Delta x}{2}(vQ_{xx} - Ap_x)_{i+1}^{n+1}\right) \\ -\alpha_L^+\left((Q^2/A)_{i-1}^{n+1} + \frac{\Delta x}{2}(vQ_{xx} - Ap_x)_{i-1}^{n+1}\right) - \\ \alpha_L^-\left((Q^2/A)_i^{n+1} - \frac{\Delta x}{2}(vQ_{xx} - Ap_x)_i^{n+1}\right)\end{array}\right\} + \right.$$

$$\left.\left(\frac{A_{i-1/2}^{n+1} + A_{i+1/2}^{n+1}}{2}\right)\frac{p_{i+1/2}^{n+1} - p_{i-1/2}^{n+1}}{\Delta x} - v\frac{Q_{i+1}^{n+1} - 2Q_i^{n+1} + Q_{i-1}^{n+1}}{\Delta x^2}\right\} + $$

$$(1-\theta)\left\{\frac{1}{\Delta x}\left\{\begin{array}{l}\alpha_R^+\left((Q^2/A)_i^n + \frac{\Delta x}{2}(vQ_{xx} - Ap_x)_i^n\right) + \\ \alpha_R^-\left((Q^2/A)_{i+1}^n - \frac{\Delta x}{2}(vQ_{xx} - Ap_x)_{i+1}^n\right) \\ -\alpha_L^+\left((Q^2/A)_{i-1}^n + \frac{\Delta x}{2}(vQ_{xx} - Ap_x)_{i-1}^n\right) - \\ \alpha_L^-\left((Q^2/A)_i^n - \frac{\Delta x}{2}(vQ_{xx} - Ap_x)_i^n\right)\end{array}\right\} + \right.$$

$$\left.\left(\frac{A_{i-1/2}^n + A_{i+1/2}^n}{2}\right)\frac{p_{i+1/2}^n - p_{i-1/2}^n}{\Delta x} - v\frac{Q_{i+1}^n - 2Q_i^n + Q_{i-1}^n}{\Delta x^2}\right\} = 0. \quad (13)$$

The error norm computed at time t=1 for N=100 and θ=1/2 (Crank-Nicolson scheme) under finite volume discretization is listed in Table 2 for various time steps.

TABLE 2

Error norm in time using re-normalization with Crank Nicholson

| Δt | $L_\infty(Q)$ | o(Q) | $L_\infty(p)$ | o(p) |
|---|---|---|---|---|
| 0.2 | 1.3817E−04 | | 2.042eE+01 | |
| 0.1 | 3.4334E−05 | 2.012 | 5.1091E+00 | 1.999 |
| 0.05 | 8.5794E−06 | 2.001 | 1.2788E+00 | 1.997 |
| 0.01 | 3.4318E−07 | 1.999 | 5.0746E−02 | 2.016 |

The re-normalized discretization procedure may be a rigorous and stable approach to discretize the governing Equations 1 and 2 at or near the boundary of a simulated SRV. The re-normalized discretization procedure may be implemented throughout the simulated SRV. The re-normalized discretization procedure may conserve mass and momentum and provide a uniform order of accuracy throughout the discrete domain. The re-normalized discretization procedure may be implemented in a wide variety of problems in engineering, such as finite difference, finite volume, finite element, finite spectral methods, and may be extended from 1-dimension to multiple dimensions.

Figure 6:
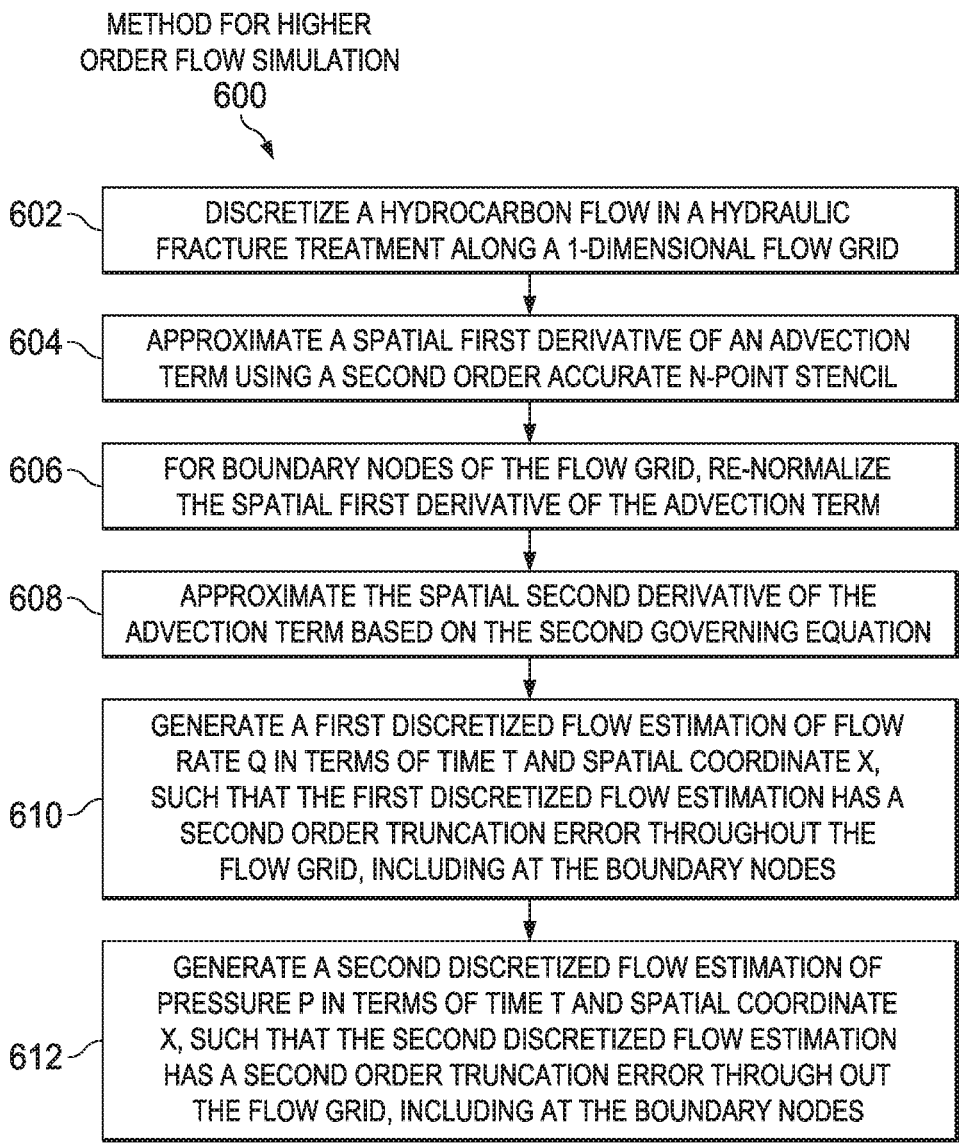
FIG. 6 illustrates a flow chart illustrating a method for higher order simulation of hydrocarbon flows of hydraulic fracture treatments.

Referring now to FIG. 6, a flow chart of method 600 for higher order simulation of hydrocarbon flows of hydraulic fracture treatments, as described herein, is illustrated. It is noted that certain operations described in method 600 may be optional or may be rearranged in different embodiments. Method 600 may begin at step 602 by discretizing a hydrocarbon flow in a hydraulic fracture treatment along a 1-dimensional flow grid. The hydrocarbon flow may be defined by Equation 1 for conservation of mass and Equation 2 for conservation of momentum. Equations 1 and 2 are continuous equations that may be valid for each node in a discrete domain defining the 1-dimensional flow grid, including boundary nodes. Because hydraulic fractures resulting from a fracture treatment may be represented as a series of 1-dimensional hydrocarbon flows (see also FIG. 2B), discretization along the 1-dimensional flow grid may be used to simulate each of the 1-dimensional hydrocarbon flows, which may be combined to estimate an aggregate production of a given well system that has been subject to the fracture treatment.

At step 604, a spatial first derivative of an advection term may be approximated using a second order accurate N-point stencil. The advection term may be included in Equation 2 for conservation of momentum. The approximation in step 604 may use a piecewise 1-dimensional solution, such as the finite difference approximation given by Equation 4a, or the finite volume approximation given by Equation 4b. The piecewise 1-dimensional solution in step 604 may be approximated using a 3-point stencil to achieve second order accuracy.

At step 606, for boundary nodes of the flow grid, the spatial first derivative of the advection term may be re-normalized. At the boundary nodes, the N-point stencil may extend beyond the flow grid and cross the domain extent. The spatial first derivative of the advection term may be re-normalized as a one-sided Taylor series in terms of the second spatial derivative of the advection term. In this manner, flow parameters for the boundary nodes may be estimated without the use of ghost nodes or invalid approximations for the stencil, while maintaining a relatively small stencil and second order accuracy.

At step 608, the spatial second derivative of the advection term may be approximated based on the second governing equation (Equation 2). The resulting finite difference discretization may be given by Equations 9a and 9b. The resulting finite volume discretization may be given by Equation 11.

At step 610, a first discretized flow estimation of flow rate Q in terms of time t and spatial coordinate x may be generated, such that the first discretized flow estimation has a second order truncation error throughout the flow grid, including at the boundary nodes.

At step 612, a first a second discretized flow estimation of pressure p in terms of time t and spatial coordinate x may be generated, such that the second discretized flow estimation has a second order truncation error throughout the flow grid, including at the boundary nodes.

Figure 7:
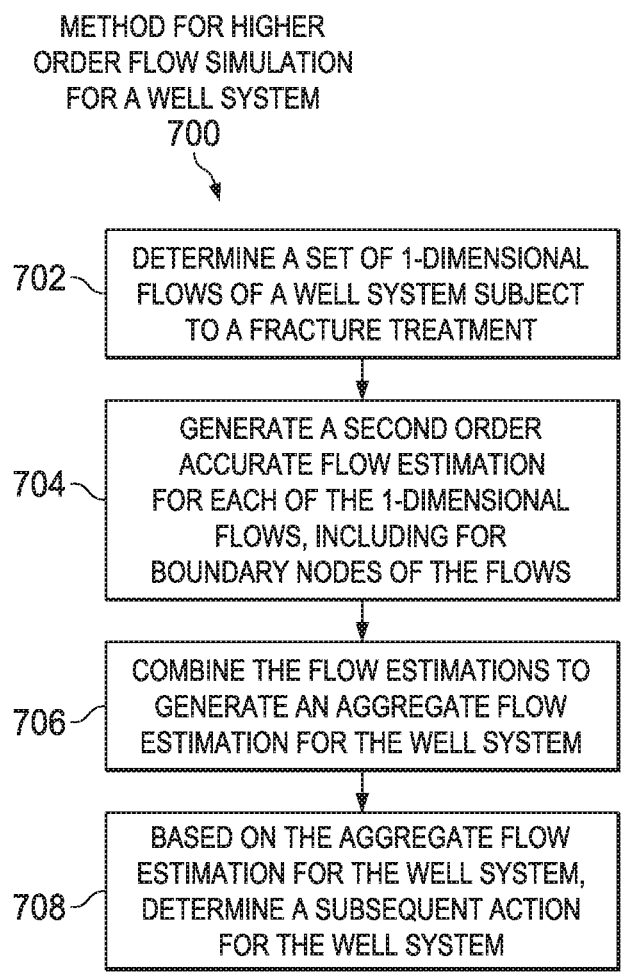
FIG. 7 illustrates a flow chart of a method for higher order simulation of hydrocarbon flows for a well system.

Referring now to FIG. 7, a flow chart of method 700 for higher order simulation of hydrocarbon flows for a well system, as described herein, is illustrated. It is noted that certain operations described in method 700 may be optional or may be rearranged in different embodiments.

Method 700 may begin at step 702 by determining a set of 1-dimensional flows of a well system subject to a fracture treatment. At step 702, 1-dimensional flows of hydraulic fractures, such as illustrated in FIG. 2B, may be determined for the well system, including determining various parameters for the flows.

At step 704, a second order accurate flow estimation for each of the 1-dimensional flows may be generated, including for boundary nodes of the flows. The estimation of each 1-dimensional flow in step 702 may be performed using method 600 in FIG. 6.

At step 706, the flow estimations from step 704 may be combined to generate an aggregate flow estimation for the well system. The combination of the flow estimations at step 706 may be based on information obtained at step 702.

At step 708, based on the aggregate flow estimation for the well system, a subsequent action for the well system may be determined. In some embodiments, the subsequent action may be a subsequent fracture treatment. In certain embodiments, the subsequent action may be a drilling activity in the well system. In particular embodiments, the subsequent action may be a production activity associated with the well system, such as operational activities to extract hydrocarbons from the well system based on the aggregate flow estimation.

In a first aspect, a computer-implemented method is disclosed for higher order simulation of hydrocarbon flows of hydraulic fracture treatments. The method may include generating a discretized hydrocarbon flow along a 1-dimensional flow grid in a hydraulic fracture treatment of a well system, the hydrocarbon flow defined by a first governing equation for conservation of mass and a second governing equation for conservation of momentum. In the method, the first governing equation and the second governing equation may be continuous equations. In the method, generating the discretized hydrocarbon flow may include approximating a spatial first derivative of an advection term of the second governing equation using a piecewise 1-dimensional solution. In the method, the spatial first derivative of the advection term may be approximated using a second order accurate n-point stencil. For boundary nodes of the flow grid for which the n-point stencil exceeds the flow grid, generating the discretized hydrocarbon flow in the method may include re-normalizing the spatial first derivative of the advection term as a one-sided Taylor series in terms of a spatial second derivative of the advection term. In the method, generating the discretized hydrocarbon flow may also include approximating the spatial second derivative of the advection term based on the second governing equation. Based on the discretized hydrocarbon flow, the method may include determining a production activity for extracting hydrocarbons from the well system.

In a second aspect, a disclosed article of manufacture includes a non-transitory computer-readable medium storing instructions for higher order simulation of hydrocarbon flows of hydraulic fracture treatments. The instructions, when executed by a processor, may cause the processor to generate a discretized hydrocarbon flow along a 1-dimensional flow grid in a hydraulic fracture treatment of a well system, the hydrocarbon flow defined by a first governing equation for conservation of mass and a second governing equation for conservation of momentum. In the article of manufacture, the first governing equation and the second governing equation may be continuous equations. The instructions to generate the discretized hydrocarbon flow, when executed by a processor, may include instructions to cause the processor to approximate a spatial first derivative of an advection term of the second governing equation using a piecewise 1-dimensional solution. In the article of manufacture, the spatial first derivative of the advection term may be approximated using a second order accurate n-point stencil. For boundary nodes of the flow grid for which the n-point stencil exceeds the flow grid, the instructions may cause a processor to re-normalize the spatial first derivative of the advection term as a one-sided Taylor series in terms of a spatial second derivative of the advection term. The instructions, when executed by a processor, may cause the processor to approximate the spatial second derivative of the advection term based on the second governing equation. Based on the discretized hydrocarbon flow, the instructions, when executed by a processor, may cause the processor to determine a production activity for extracting hydrocarbons from the well system.

In a third aspect, a disclosed computer system is for computer system for higher order simulation of hydrocarbon flows of hydraulic fracture treatments. The computer system may include a processor and a memory communicatively coupled to the processor, the memory storing instructions executable by the processor. In the computer system, the instructions, when executed by the processor, may cause the processor to generate a discretized hydrocarbon flow along a 1-dimensional flow grid in a hydraulic fracture treatment of a well system, the hydrocarbon flow defined by a first governing equation for conservation of mass and a second governing equation for conservation of momentum. In the computer system, the first governing equation and the second governing equation may be continuous equations. In the computer system, the instructions, when executed by the processor, may cause the processor to approximate a spatial first derivative of an advection term of the second governing equation using a piecewise 1-dimensional solution. In the computer system, the spatial first derivative of the advection term may be approximated using a second order accurate n-point stencil. For boundary nodes of the flow grid for which the n-point stencil exceeds the flow grid, in the computer system, the instructions to generate the discretized hydrocarbon flow, when executed by a processor, may include instructions to cause the processor to re-normalize the spatial first derivative of the advection term as a one-sided Taylor series in terms of a spatial second derivative of the advection term. In the computer system, the instructions, when executed by the processor, may cause the processor to approximate the spatial second derivative of the advection term based on the second governing equation. In the computer system, based on the discretized hydrocarbon flow, the instructions, when executed by the processor, may cause the processor to determine a production activity for extracting hydrocarbons from the well system.

In any embodiment of each of the disclosed aspects, first governing equation for conservation of mass may be given by:

$$\frac{\partial A}{\partial t} + \frac{\partial Q}{\partial x} = 0,$$

where A is a cross-sectional area of the hydrocarbon flow, t is time, x is a spatial coordinate along the flow grid, and Q is a flow rate of the hydrocarbon flow. In any embodiment of each of the disclosed aspects, the second governing equation for conservation of momentum may be given by:

$$\frac{\partial Q}{\partial t} + \frac{\partial (\phi)}{\partial x} + A\frac{\partial p}{\partial x} - v\frac{\partial^2 Q}{\partial x^2} = 0,$$

where p is a pressure of the hydrocarbon flow, v is a viscosity of the hydrocarbon flow, and $\varphi$ is the advection term given by $\varphi = Q^2/A$.

In any embodiment of each of the disclosed aspects, generating the discretized hydrocarbon flow in the method may include generating a first discretized flow estimation of Q(t, x), and generating a second discretized flow estimation of p(t,x), such that both the first discretized flow estimation and the second discretized flow estimation may have a second order truncation error throughout the flow grid, including the boundary nodes.

In any embodiment of each of the disclosed aspects, the instructions to generate the discretized hydrocarbon flow may include instructions to generate a first discretized flow estimation of Q (t, x), and generate a second discretized flow estimation of p(t, x), such that both the first discretized flow estimation and the second discretized flow estimation may have a second order truncation error throughout the flow grid, including the boundary nodes.

In any embodiment of each of the disclosed aspects, re-normalizing of the spatial first derivative of the advection term may include discretizing the hydrocarbon flow using a time integration scheme selected from one of: a Backward Euler time integration scheme, a Crank-Nicholson scheme, and a forward difference scheme. In any embodiment of each of the disclosed aspects, the n-point stencil may be a 3-point stencil.

In any embodiment of each of the disclosed aspects, the instructions to re-normalize the spatial first derivative of the advection term may include instructions to discretize the hydrocarbon flow using a time integration scheme selected from one of: a Backward Euler time integration scheme, a Crank-Nicholson scheme, and a forward difference scheme.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein or in the absence of any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each item of the list. The phrase "at least one of" allows a meaning that includes at least one of any one of the items, at least one of any combination of the items, and at least one of each of the items. By way of example, the phrases "at least one of A, B, and C" or "at least one of A, B, or C" may each refer to only A, only B, or only C; any combination of A, B, and C; or at least one of each of A, B, and C.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A computer-implemented method for simulation of hydrocarbon flows of hydraulic fracture treatments using higher-order simulations with improved accuracy and stability, the method comprising:
    generating a discretized hydrocarbon flow along a 1-dimensional flow grid in a hydraulic fracture treatment of a well system, the hydrocarbon flow defined by a first governing equation for conservation of mass and a second governing equation for conservation of momentum, wherein the first governing equation and the second governing equation are continuous equations, further comprising:
        approximating a spatial first derivative of an advection term of the second governing equation using a piecewise 1-dimensional solution, wherein the spatial first derivative of the advection term is approximated using a second order accurate n-point stencil;
        for boundary nodes of the flow grid for which the n-point stencil exceeds the flow grid, re-normalizing the spatial first derivative of the advection term as a one-sided Taylor series in terms of a spatial second derivative of the advection term; and
        approximating the spatial second derivative of the advection term based on the second governing equation; and
    based on the discretized hydrocarbon flow, determining a fracture treatment for injecting fluid into the well system to fracture a formation for extracting hydrocarbons from the well system.

2. The method of claim 1, wherein the first governing equation for conservation of mass is given by:

$$\frac{\partial A}{\partial t} + \frac{\partial Q}{\partial x} = 0$$

wherein A is a cross-sectional area of the hydrocarbon flow, t is time, x is a spatial coordinate along the flow grid, and Q is a flow rate of the hydrocarbon flow.

3. The method of claim 2, wherein the second governing equation for conservation of momentum is given by:

$$\frac{\partial Q}{\partial t} + \frac{\partial(\phi)}{\partial x} + A\frac{\partial p}{\partial x} - v\frac{\partial^2 Q}{\partial x^2} = 0$$

wherein p is a pressure of the hydrocarbon flow, v is a viscosity of the hydrocarbon flow, and φ is the advection term given by $\varphi = Q^2/A$.

4. The method of claim 3, wherein generating the discretized hydrocarbon flow further comprises:
    generating a first discretized flow estimation of Q(t,x); and
    generating a second discretized flow estimation of p(t,x), wherein both the first discretized flow estimation and the second discretized flow estimation have a second order truncation error throughout the flow grid, including at the boundary nodes.

5. The method of claim 3, wherein re-normalizing of the spatial first derivative of the advection term further comprises:
    discretizing the hydrocarbon flow using a time integration scheme selected from one of:
        a Backward Euler time integration scheme;
        a Crank-Nicholson scheme; and
        a forward difference scheme.

6. The method of claim 1, wherein the n-point stencil is a 3-point stencil.

7. An article of manufacture comprising a non-transitory computer-readable medium storing instructions for simulation of hydrocarbon flows of hydraulic fracture treatments using higher-order simulations with improved accuracy and stability, wherein the instructions, when executed by a processor, cause the processor to:
    generate a discretized hydrocarbon flow along a 1-dimensional flow grid in a hydraulic fracture treatment of a well system, the hydrocarbon flow defined by a first governing equation for conservation of mass and a second governing equation for conservation of momentum, wherein the first governing equation and the second governing equation are continuous equations, including instructions to:
        approximate a spatial first derivative of an advection term of the second governing equation using a piecewise 1-dimensional solution, wherein the spatial first derivative of the advection term is approximated using a second order accurate n-point stencil;
        for boundary nodes of the flow grid for which the n-point stencil exceeds the flow grid, re-normalize the spatial first derivative of the advection term as a one-sided Taylor series in terms of a spatial second derivative of the advection term; and
        approximate the spatial second derivative of the advection term based on the second governing equation; and
    based on the discretized hydrocarbon flow, determine a fracture treatment for injecting fluid into the well system to fracture a formation for extracting hydrocarbons from the well system.

8. The article of manufacture of claim 7, wherein the first governing equation for conservation of mass is given by:

$$\frac{\partial A}{\partial t} + \frac{\partial Q}{\partial x} = 0$$

wherein A is a cross-sectional area of the hydrocarbon flow, t is time, x is a spatial coordinate along the flow grid, and Q is a flow rate of the hydrocarbon flow.

9. The article of manufacture of claim 7, wherein the second governing equation for conservation of momentum is given by:

$$\frac{\partial Q}{\partial t} + \frac{\partial(\phi)}{\partial x} + A\frac{\partial p}{\partial x} - v\frac{\partial^2 Q}{\partial x^2} = 0$$

wherein p is a pressure of the hydrocarbon flow, v is a viscosity of the hydrocarbon flow, and φ is the advection term given by $\varphi = Q^2/A$.

10. The article of manufacture of claim 9, wherein the instructions to generate the discretized hydrocarbon flow further comprise instructions to:

generate a first discretized flow estimation of Q(t,x); and generate a second discretized flow estimation of p(t,x), wherein both the first discretized flow estimation and the second discretized flow estimation have a second order truncation error throughout the flow grid, including the boundary nodes.

11. The article of manufacture of claim 9, wherein the instructions to re-normalize the spatial first derivative of the advection term further comprise instructions to:

discretizing the hydrocarbon flow using a time integration scheme selected from one of:

a Backward Euler time integration scheme;

a Crank-Nicholson scheme; and a forward difference scheme.

12. The article of manufacture of claim 7, wherein the n-point stencil is a 3-point stencil.

13. A computer system for simulation of hydrocarbon flows of hydraulic fracture treatments using higher-order simulations with improved accuracy and stability, the computer system comprising:

a processor; and a memory communicatively coupled to the processor, the memory storing instructions executable by the processor, wherein the instructions, when executed by the processor, cause the processor to:

generate a discretized hydrocarbon flow along a 1-dimensional flow grid in a hydraulic fracture treatment of a well system, the hydrocarbon flow defined by a first governing equation for conservation of mass and a second governing equation for conservation of momentum, wherein the first governing equation and the second governing equation are continuous equations, including instructions to:

approximate a spatial first derivative of an advection term of the second governing equation using a piecewise 1-dimensional solution, wherein the spatial first derivative of the advection term is approximated using a second order accurate n-point stencil;

for boundary nodes of the flow grid for which the n-point stencil exceeds the flow grid, re-normalize the spatial first derivative of the advection term as a one-sided Taylor series in terms of a spatial second derivative of the advection term; and approximate the spatial second derivative of the advection term based on the second governing equation; and based on the discretized hydrocarbon flow, determine a fracture treatment for injecting fluid into the well system to fracture a formation for extracting hydrocarbons from the well system.

14. The computer system of claim 13, wherein the first governing equation for conservation of mass is given by:

$$\frac{\partial A}{\partial t} + \frac{\partial Q}{\partial x} = 0$$

wherein A is a cross-sectional area of the hydrocarbon flow, t is time, x is a spatial coordinate along the flow grid, and Q is a flow rate of the hydrocarbon flow.

15. The computer system of claim 14, wherein the second governing equation for conservation of momentum is given by:

$$\frac{\partial Q}{\partial t} + \frac{\partial(\phi)}{\partial x} + A\frac{\partial p}{\partial x} - v\frac{\partial^2 Q}{\partial x^2} = 0$$

wherein p is a pressure of the hydrocarbon flow, $v$ is a viscosity of the hydrocarbon flow, and $\varphi$ is the advection term given by $\varphi = Q^2/A$.

16. The computer system of claim 15, wherein the instructions to generate the discretized hydrocarbon flow further comprise instructions to:

generate a first discretized flow estimation of Q(t,x); and generate a second discretized flow estimation of p(t,x), wherein both the first discretized flow estimation and the second discretized flow estimation have a second order truncation error throughout the flow grid, including the boundary nodes.

17. The computer system of claim 15, wherein the instructions to re-normalize the spatial first derivative of the advection term further comprise instructions to:

discretizing the hydrocarbon flow using a time integration scheme selected from one of:

a Backward Euler time integration scheme;

a Crank-Nicholson scheme; and a forward difference scheme.

18. The computer system of claim 13, wherein the n-point stencil is a 3-point stencil.

* * * * *